United States Patent [19]
M'Saad

[11] Patent Number: 6,013,584
[45] Date of Patent: Jan. 11, 2000

[54] METHODS AND APPARATUS FOR FORMING HDP-CVD PSG FILM USED FOR ADVANCED PRE-METAL DIELECTRIC LAYER APPLICATIONS

[75] Inventor: Hichem M'Saad, Grenoble, France

[73] Assignee: Applied Materials, Inc., Santa Clara, Calif.

[21] Appl. No.: 08/803,041

[22] Filed: Feb. 19, 1997

[51] Int. Cl.[7] .......................... H01L 21/31; H01L 21/469
[52] U.S. Cl. ........................... 438/783; 438/784; 438/788
[58] Field of Search ................................... 438/783, 784, 438/788

[56] References Cited

U.S. PATENT DOCUMENTS

| | | |
|---|---|---|
| 3,481,781 | 12/1969 | Kern . |
| 4,178,877 | 12/1979 | Kudo ........................... 118/728 |
| 4,394,401 | 7/1983 | Shioya et al. . |
| 4,443,489 | 4/1984 | Cowher et al. ................ 427/38 |
| 4,486,465 | 12/1984 | Nguygen . |
| 4,513,026 | 4/1985 | Miyamoto et al. . |
| 4,781,945 | 11/1988 | Nishimura et al. ........... 427/255 |
| 4,830,974 | 5/1989 | Chang et al. . |
| 4,920,077 | 4/1990 | Mora ............................ 437/240 |
| 4,948,757 | 8/1990 | Jain et al. ..................... 437/240 |
| 4,962,063 | 10/1990 | Maydan et al. ............... 437/228 |
| 5,082,517 | 1/1992 | Moslehi ........................ 156/345 |
| 5,100,817 | 3/1992 | Cederbaum et al. . |
| 5,112,776 | 5/1992 | Marks et al. .................. 437/228 |
| 5,204,288 | 4/1993 | Marks et al. .................. 437/228 |
| 5,279,865 | 1/1994 | Chebi et al. ................... 427/574 |
| 5,409,743 | 4/1995 | Bouffard ....................... 427/579 |
| 5,484,749 | 1/1996 | Maeda et al. . |
| 5,525,379 | 6/1996 | Takada et al. ................. 427/571 |
| 5,747,389 | 5/1998 | Chu . |

OTHER PUBLICATIONS

Wolf, S. and Tauber, R.N. Silicon Processesing for the VLSI Era, vol.. 1, Lattice Press, Sunset Beach, p. 361, 1986.

Levin R.M. and Adams, A.C., "Low Pressure Deposition of Phosphosilicate Glass Films", *J. Electrochem Soc.: Solid–State Science and Technology*, Jul. 1982, pp. 1588–1592.

*Primary Examiner*—John F. Niebling
*Assistant Examiner*—Josetta I. Jones
*Attorney, Agent, or Firm*—Townsend & Townsend & Crew

[57] ABSTRACT

An apparatus and methods for forming a dielectric layer, such as PSG, that exhibits low moisture content, good gap fill capability, good gettering capability, and compatibility with planarization techniques. The PSG film deposited using the apparatus and methods of the present invention are particularly suitable for use as a PMD layer. According to one embodiment, the present invention provides a process for depositing a film on a substrate disposed on a pedestal in a processing chamber. The process includes introducing a process gas into said processing chamber, where the process gas includes $SiH_4$, $PH_3$, $O_2$, and argon. The process also includes controlling the temperature of the pedestal to between about 400–650° C. during a first time period, maintaining a pressure ranging between about 1–10 millitorr in the processing chamber during the first time period. In addition, the process includes applying power to an inductively coupled coil to form a high density plasma from the process gas in the processing chamber during the first time period, and biasing the plasma toward the substrate to promote a sputtering effect of the plasma and deposit the phosphosilicate glass (PSG) film over the substrate during the first time period. In related embodiments, the process may include the further step of annealing the film or of chemical mechanical polishing the film.

22 Claims, 13 Drawing Sheets

METHODS AND APPARATUS FOR FORMING HDP-CVD PSG FILM USED FOR ADVANCED PRE-METAL DIELECTRIC LAYER APPLICATIONS

BACKGROUND OF THE INVENTION

The present invention relates to substrate processing, and more specifically to a method and apparatus for forming a dielectric film such as a phosphosilicate glass (PSG) film having good gap fill capability, good stability, and compatibility with planarization techniques. The present invention is particularly useful when forming a dielectric film used for advanced premetal dielectric (PMD) layer applications. Of course, the dielectric film may also be useful for other applications.

Semiconductor device geometries have dramatically decreased in size since such devices were first introduced several decades ago. Since then, integrated circuits have generally followed the two-year/half-size rule (often called "Moore's Law") which means that the number of devices that fit on a chip doubles every two years. Wafer fabrication plants today are routinely producing devices with 0.5 $\mu$m and even 0.35 $\mu$m size features. Fabrication plants soon will be producing devices having even smaller geometries. As device sizes become smaller and integration density increases, issues that were not previously considered crucial by the industry are becoming of paramount concern.

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or plasma-enhanced chemical vapor deposition (PECVD) processes. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film. Examples of apparatus utilizing conventional plasma processes include, for example, a capacitively-coupled parallel plate CVD apparatus, or an electron cyclotron resonance (ECR) CVD apparatus. In general, reaction rates in thermal and plasma processes may be controlled by controlling one or more of the following: temperature, pressure, and reactant gas flow rate.

One particular use for a silicon oxide film is as a separation layer between the polysilicon gate/interconnect layer and the first metal contact layer for MOS transistor connections. Such separation layers, referred to as PMD layers, are typically deposited before any of the metal layers in a multi-level metal structure. It is important that films used as PMD layers have low stress, good gettering capability, good gap fill capability, either good planarization characteristics or compatibility with planarization techniques, and low moisture absorption. Specifically, low stress in films used as PMD layers is required in order to avoid cracking or bowing of the wafer which can damage the devices formed thereon. In addition, films used as PMD layers need to have good gettering capability to trap mobile ions/charges (such as sodium or other metal ions) that may cause damage in the formed devices. When used as a PMD layer, the silicon oxide film is deposited over a lower level polysilicon gate/interconnect layer that usually contains raised or stepped surfaces, which create gaps that need to be adequately filled by the film. If these gaps are not adequately filled by the film, voids or seams in the film may occur and cause degraded device performance. The initially deposited film generally conforms to the topography of the poly layer and typically needs to be planarized before an overlying metal layer is deposited. A standard reflow process, in which the oxide film is heated to a temperature at which it flows, may be used to planarize the film. With small device dimensions, it is critical in some applications that reflow of PMD layers and other process steps be carried out below 800° C. to maintain shallow junctions and prevent the degradation of self-aligned titanium silicide contact structures or the like. As an alternative to reflow, a chemical mechanical polishing (CMP) technique may be used to planarize the film. In addition, low moisture absorption is important for films used as PMD layers. Moisture absorbed into the film often reacts with the dopants in the film resulting in film crystallization, increasing the potential for undesirable cracking of the deposited film and leading to damaged devices.

Although typically used as PMD layers, borophosphosilicate glass (BPSG) films are becoming inadequate in some applications having tight thermal budgets. Because of their low stress, good gap fill capability, good gettering capability, and capability to reflow at high temperatures, BPSG films are an example of films that have been found particularly suitable for use as PMD layers. Standard BPSG films may be formed by introducing phosphorus and boron sources into a processing chamber along with the silicon and oxygen sources normally required to form a silicon oxide layer. Deposition techniques for such BPSG films include atmospheric pressure CVD (APCVD), sub-atmospheric pressure CVD (SACVD), low pressure CVD (LPCVD), and plasma-enhanced CVD (PECVD). Many semiconductor manufacturers utilize $SiH_4$-based BPSG processes that produce films requiring reflow at temperatures greater than about 900° C. for about 0.5 $\mu$m device geometries. At geometries less than 0.5 $\mu$m, more stringent gap fill requirements may necessitate the use of chemistries such as tetraethylorthosilicate (TEOS) and ozone ($O_3$) which provide films with excellent gap fill and reflow capability. For example, TEOS/$O_3$-based BPSG films produced by APCVD or SACVD achieve improved gap fill, but planarization by reflow at greater than about 850–900° C. or by a rapid thermal process and a CMP step may be required for many applications. In general, typical BPSG films used for PMD applications may require a reflow process at temperatures greater than about 850° C. and a CMP step in order to provide a planarized layer. However, such reflow temperatures are often too high for tighter thermal budgets that are increasingly required for advanced PMD applications in smaller geometry (0.25 $\mu$m and less) devices. Further, other film properties such as low moisture absorption are important for films used as PMD layers. Typical BPSG films used as PMD layers may require certain boron concentrations in order to adequately reflow for planarization, but such films may be prone to increased moisture absorption at these boron concentrations. The absorption of moisture often reacts with the BPSG film resulting in film crystallization, which may lead to cracking of the deposited film to damage devices on the wafer.

As an alternative to BPSG films, PSG films deposited using PECVD or APCVD have been proposed but found inadequate for some advanced PMD applications. These PSG films tend to absorb moisture and undesirably have a high hydrogen and carbon content in the film. Further, such PSG films are often incompatible with CMP, especially for devices having higher aspect ratios. PECVD and APCVD techniques result in high conformality films which often leave seams in the middle of the gaps being filled. During CMP, these seams are easily attacked by the slurry, and these seams may even be observed by scanning electron microscopy (SEM).

From the above, it can be seen that other methods and apparatus for forming an oxide film having low stress, good gap fill capability, compatibility with planarization techniques, and low moisture absorption are needed for some advanced PMD applications.

SUMMARY OF THE INVENTION

The present invention provides an apparatus and methods for forming a dielectric layer, such as PSG, that exhibits low moisture content, good gap fill capability, good gettering capability, and compatibility with planarization techniques. The PSG film deposited using the apparatus and methods of the present invention are particularly suitable for use as a PMD layer.

According to one embodiment, the present invention provides a process for depositing a film on a substrate disposed on a pedestal in a processing chamber. The process includes introducing a process gas into said processing chamber, where the process gas includes $SiH_4$, $PH_3$, $O_2$, and argon. The process also includes controlling the temperature of the pedestal to between about 400–650° C. during a first time period, maintaining a pressure ranging between about 1–10 millitorr in the processing chamber during the first time period. In addition, the process includes applying power to an inductively coupled coil to form a high density plasma from the process gas in the processing chamber during the first time period, and biasing the plasma toward the substrate to promote a sputtering effect of the plasma and deposit the phosphosilicate glass (PSG) film over the substrate during the first time period. In related embodiments, the process may include the further step of annealing the film or of chemical mechanical polishing the film.

According to another embodiment, the present invention also provides apparatus for providing the PSG film, which is particularly suitable for use as a PMD layer in some applications. These and other embodiments of the present invention, as well as its advantages and features are described in more detail in conjunction with the text below and attached figures.

DETAILED DESCRIPTION OF THE SPECIFIC EMBODIMENTS

1. An Exemplary CVD System

Figure 1A:
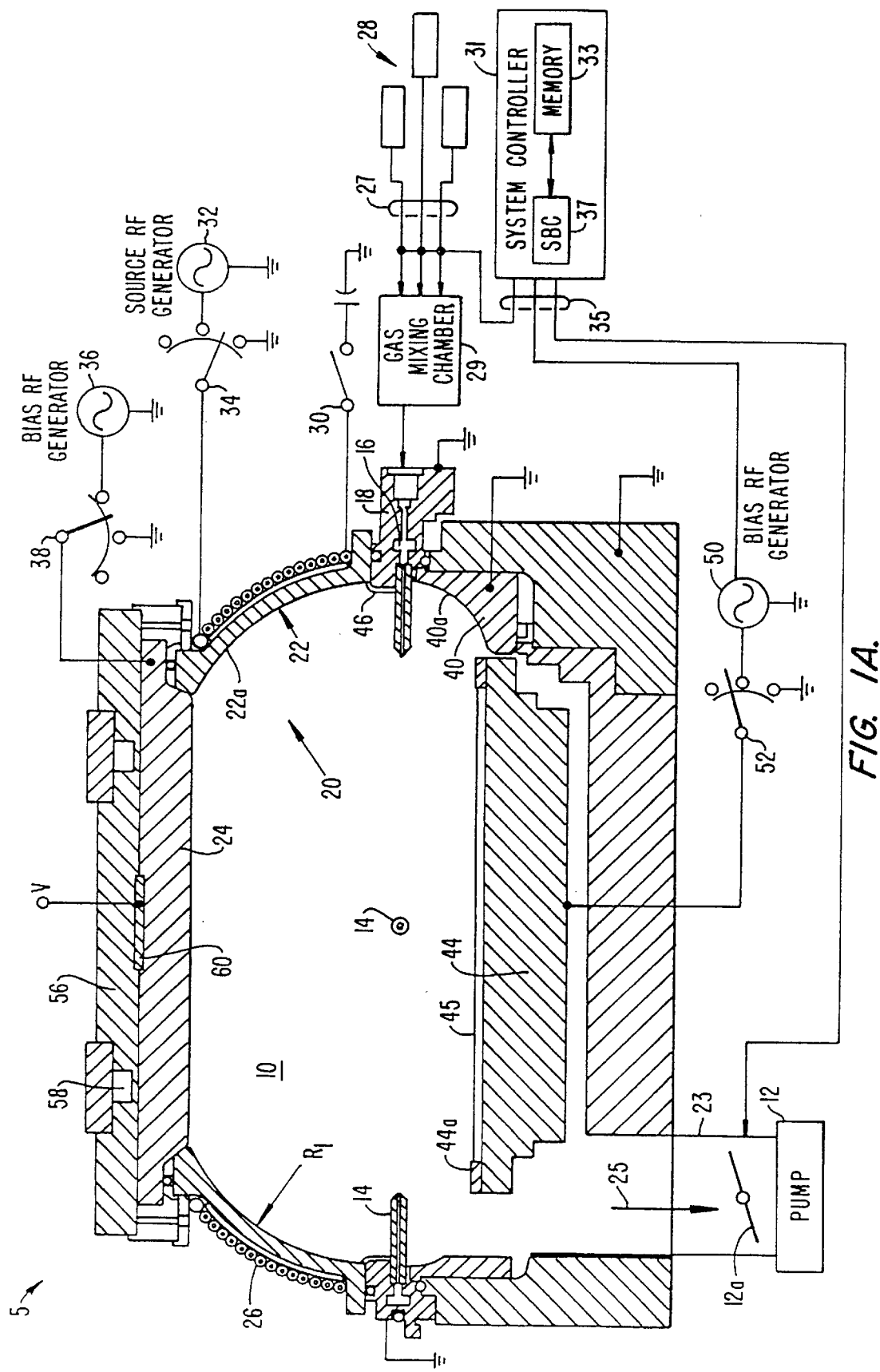
FIG. 1A is a vertical, cross-sectional view of one embodiment of a simplified high density plasma chemical vapor deposition (HDP-CVD) apparatus according to the present invention.

FIG. 1A illustrates one embodiment of a high density plasma (HDP) CVD system 5 in which the dielectric layer according to the present invention can be deposited. HDP-CVD system 5 includes a vacuum chamber 10, a vacuum pump 12, a bias RF (BRF) generator 36, and a source RF (SRF) generator 32.

Vacuum chamber 10 includes a ceiling 20 consisting of a sidewall 22 and a disk-shaped ceiling electrode 24. Sidewall 22 is made of an insulator such as quartz or ceramic and supports coiled antenna 26. The structural details of coiled antenna 26 are disclosed in U.S. patent application Ser. No. 08/113,776 entitled "High Density Plasma CVD and Etching Reactor," by Fairbairn and Nowak, filed Aug. 27, 1993, the disclosure of which is incorporated herein by reference.

Deposition gases and liquids are supplied from gas sources 28 through lines 27, having control valves not shown, into a gas mixing chamber 29 where they are combined and sent to gas supply ring manifold 16. Generally, each gas supply line for each process gas includes (i) safety shut-off valves (not shown) that can be used to automatically or manually shut off the flow of process gas into the chamber, and (ii) mass flow controllers (MFCs) (also not shown) that measure the flow of gas through the gas supply lines. When toxic gases are used in the process, the several safety shut-off valves are positioned on each gas supply line in conventional configurations.

Gas injection nozzles 14 are coupled to gas supply ring manifold 16 and disperse deposition gases introduced into manifold 16 to a substrate 45 resting on a pedestal 44 within chamber 10. Additionally, a center gas injection nozzle (not shown) and a center annulus (not shown) admit gases to chamber 10 above substrate 45. Deposition gases introduced through gas injection nozzles 14, center gas injection nozzle, and center annulus may be of the same or different compositions. Pedestal 44 contains an electrostatic chuck or similar mechanism to restrain the wafer during processing and may also contain cooling passages and other features. In some embodiments, pedestal 44 may be moved up and down by a motor (not shown) into various processing positions.

Gas supply ring manifold 16 is positioned within a housing 18. Housing 18 is protected from reagents by a skirt 46. Skirt 46 is composed of a substance, such as quartz, ceramic, silicon or polysilicon, which is resistant to the reagents used in the HDP-CVD process. The bottom of vacuum chamber 10 may include an annular liner 40, which itself may be made removable.

An inductively coupled plasma of the deposition gases can be formed adjacent to substrate 45 by RF energy applied to coiled antenna 26 from source RF generator 32. Source RF generator 32 can supply either single or mixed frequency RF power (or other desired variation) to coiled antenna 26 to enhance the decomposition of reactive species introduced into vacuum chamber 10. A plasma formed in such a manner has a relatively high density (on the order of $10^{11}$ to $10^{12}$ ions/cm$^3$) as compared with a plasma (having a density on the order of $10^9$ to $10^{10}$ ions/cm$^3$) formed by standard PECVD reactors. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depends upon the plasma's desired characteristics. BRF generators 36 and 50 can supply either single or mixed frequency RF power (or other desired variation). BRF generators 36 and 50 may be separate RF generators, or may be a single RF generator with a switch connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increasing the gap-fill capability of a film).

Capacitive coupling may also be used to form the plasma. Such a plasma may be formed between ceiling electrode 24 and pedestal 44 or in a similar fashion.

BRF generators 36 and 50, SRF generator 32, throttle valve 12a, the MFCs connected to lines 27, switches 30, 34, 38 and 52, and other elements in CVD system 5 are all controlled by a system controller 31 over control lines 35, only some of which are shown. System controller 31 operates under the control of a computer program stored in a computer-readable medium such as a memory 33, which, in the preferred embodiment is a hard disk drive. The computer program dictates the timing, introduction rate and mixture of gases, chamber pressure, chamber temperature, RF power levels and other parameters of a particular process. Motors and optical sensors are used to move and determine the position of movable mechanical assemblies such as throttle valve 12a and pedestal 44.

System controller 31 controls all of the activities of the CVD apparatus. In a preferred embodiment, controller 31 includes a hard disk drive (memory 33), a floppy disk drive, and a card rack. The card rack contains a single board computer (SBC) 37, analog and digital input/output boards, interface boards and stepper motor controller boards (only some of which are shown). The system controller conforms to the Versa Modular European (VME) standard which defines board, card cage, and connector dimensions and types. The VME also defines the bus structure having a 16-bit data bus and 24-bit address bus.

Figure 1B:
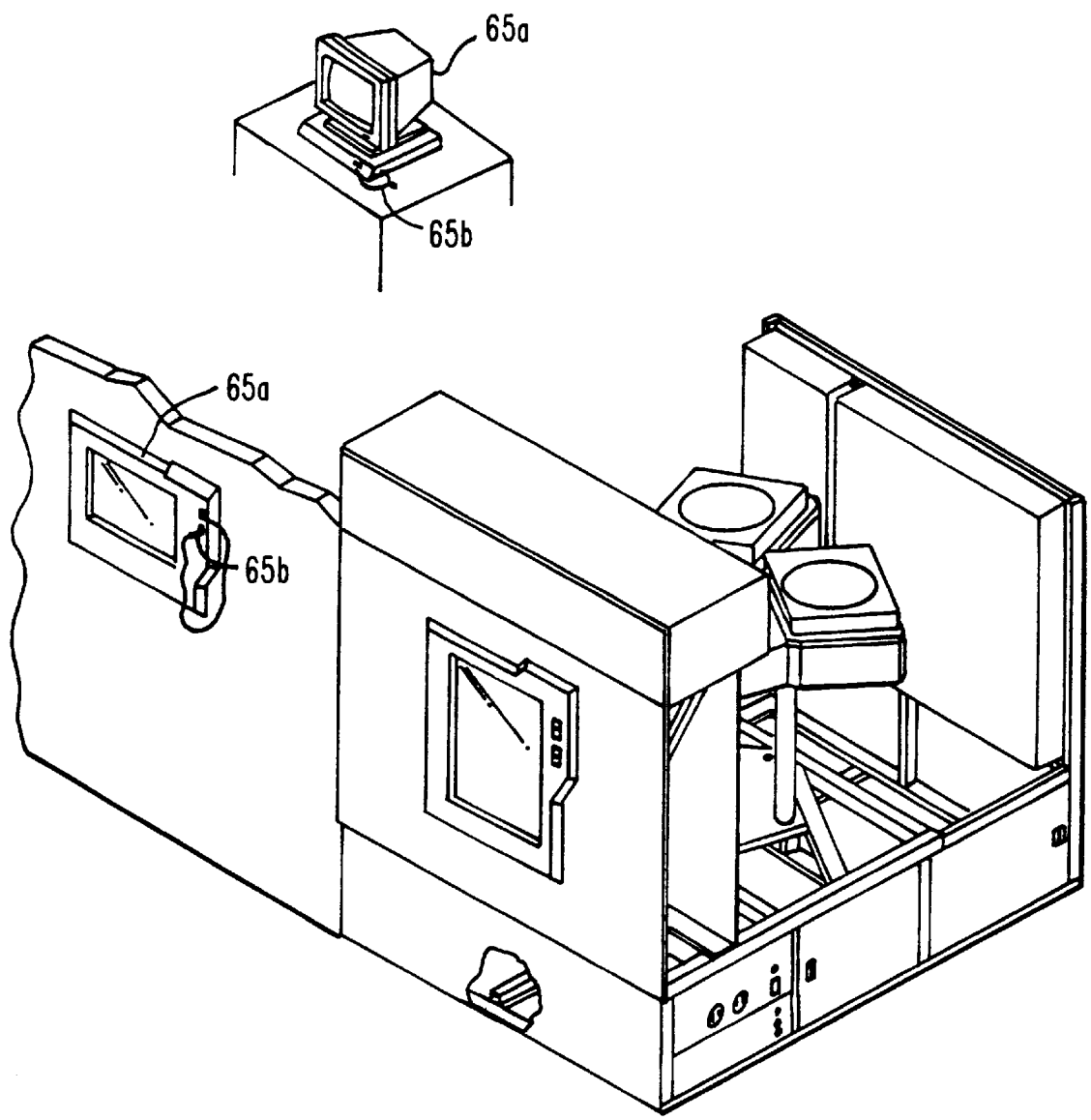
FIG. 1B is a diagram of an exemplary system monitor used in conjunction with. the exemplary CVD processing chamber of FIG. 1A.

System controller 31 operates under the control of a computer program stored on the hard disk drive. The computer program dictates the timing, mixture of gases, RF power levels and other parameters of a particular process. The interface between a user and the system controller is via a CRT monitor 65a and a light pen 65b which is depicted in FIG. 1B. In the preferred embodiment two monitors 65a are used, one mounted in the clean room wall for the operators and the other behind the wall for the service technicians. Both monitors 65a simultaneously display the same information, but only one light pen 65b is enabled. Light pen 65b detects light emitted by CRT display with a light sensor in the tip of the pen. To select a particular screen or function, the operator touches a designated area of the display screen and pushes the button on pen 65b. The touched area changes its highlighted color, or a new menu or screen is displayed, confirming communication between the light pen and the display screen.

The process can be implemented using a computer program product 141 that runs on, for example, system controller 31. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled Windows™ library routines. To execute the linked compiled object code, the system user invokes the object code, causing the computer system to load the code in memory, from which the CPU reads and executes the code to perform the tasks identified in the program.

Figure 1C:
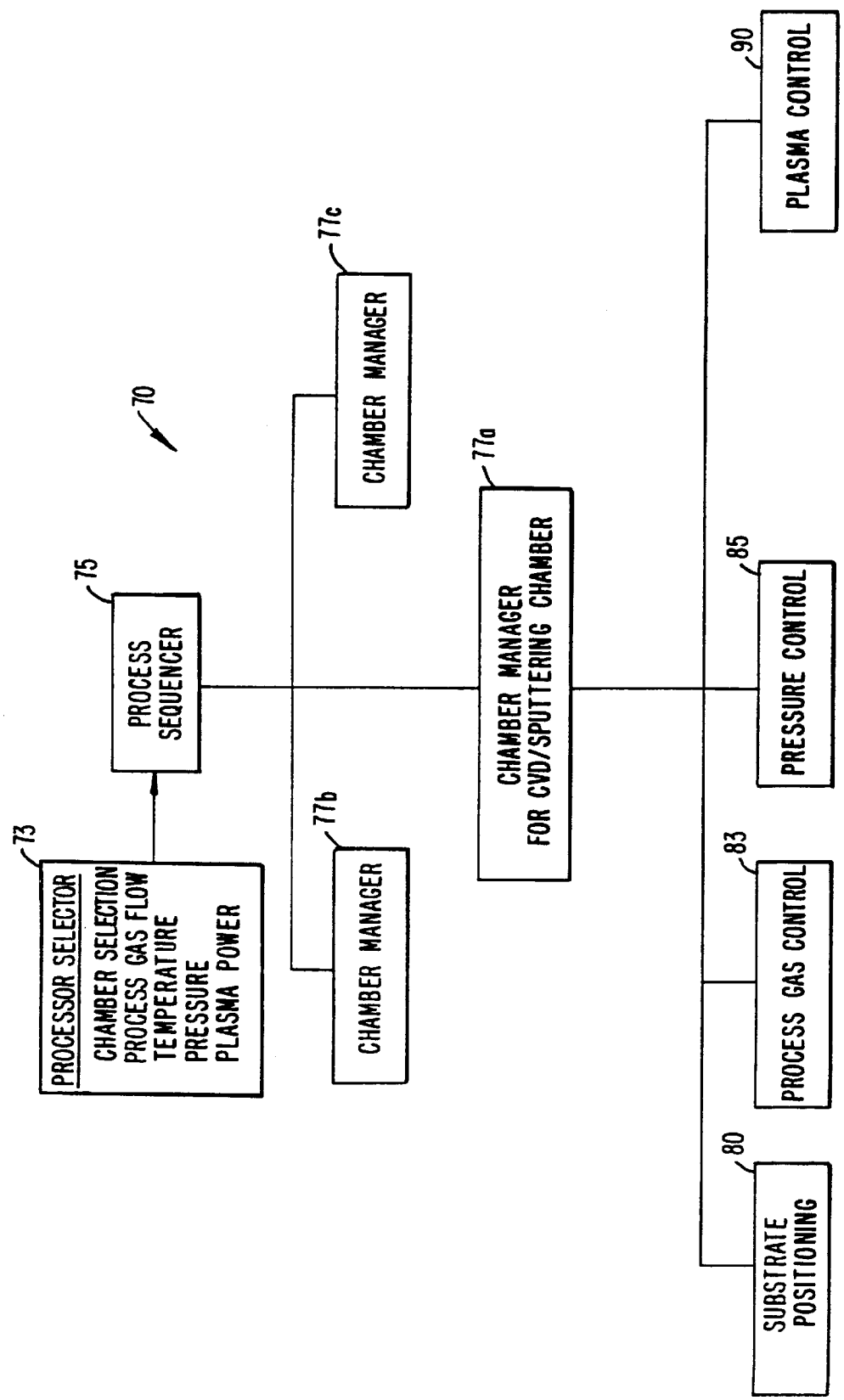
FIG. 1C is a flow chart of an exemplary process control computer program product used to control the CVD processing chamber of FIG. 1A.

FIG. 1C shows an illustrative block diagram of the hierarchical control structure of computer program 70. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, heat-transfer gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 31.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so sequencer subroutine 75 operates to schedule the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 75 determines which process chamber and process set combination is going to be executed next, sequencer subroutine 75 causes execution of the process set by passing the particular process set parameters to a chamber manager subroutine 77a–c which controls multiple processing tasks in process chamber 10 according to the process set determined by sequencer subroutine 75. For example, chamber manager subroutine 77a comprises program code for controlling sputtering and CVD process operations in process chamber 10. Chamber manager subroutine 77a also controls execution of various chamber component subroutines which control operation of the chamber components necessary to carry out the selected process set.

Examples of chamber component subroutines are substrate positioning subroutine 80, process gas control subroutine 83, pressure control subroutine 85, and plasma control subroutine 90. Those having ordinary skill in the art will recognize that other chamber control subroutines can be included depending on what processes are desired to be performed in process chamber 10. In operation, chamber manager subroutine 77a selectively schedules or calls the process component subroutines in accordance with the particular process set being executed. Scheduling by chamber manager subroutine 77a is performed in a manner similar to that used by sequencer subroutine 75 in scheduling which process chamber 10 and process set is to be executed. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1C. Substrate positioning subroutine 80 comprises program code for controlling chamber components that are used to load a substrate onto pedestal 44 and to move the pedestal to a processing position. Substrate positioning subroutine 80 may also control transfer of a substrate into chamber 10 from, e.g., a PECVD reactor or other reactor chamber in the multichamber system, after other processing has been completed.

Process gas control subroutine 83 has program code for controlling process gas composition and flow rates. Subroutine 83 controls the open/close position of the safety shut-off valves, and also ramps up/down the mass flow controllers to obtain the desired gas flow rate. All chamber component subroutines, including process gas control subroutine 83, are invoked by chamber manager subroutine 77a. Subroutine 83 receives process parameters from the chamber manager subroutine related to the desired gas flow rates.

Typically, process gas control subroutine 83 operates by opening the gas supply lines, and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates, and activating the safety shut-off valves when an unsafe condition is detected.

The process gas control subroutine 83 also controls the flow of heat-transfer gas, such as helium (He), through the inner and outer passages in the wafer chuck. The gas flow thermally couples the substrate to the chuck. In a typical process, the wafer is heated by the plasma and the chemical reactions that form the layer, and the He cools the substrate through the chuck. This keeps the substrate below a temperature that may damage pre-existing features on the substrate.

Pressure control subroutine 85 includes program code for controlling the pressure in chamber 10 by regulating the size of the opening of throttle valve 12a in the exhaust portion of the chamber. The size of the opening of throttle valve 12a is set to control the chamber pressure to the desired level in relation to the total process gas flow, size of the process chamber, and pumping setpoint pressure for the exhaust system. When pressure control subroutine 85 is invoked, the desired, or target, pressure level is received as a parameter from chamber manager subroutine 77a. Pressure control subroutine 147 operates to measure the pressure in chamber 10 by reading one or more conventional pressure manometers connected to the chamber, compare the measure value (s) to the target pressure, obtain proportional, integral, and differential (PID) values from a stored pressure table corresponding to the target pressure, and adjust the throttle valve 12a according to the PID values obtained from the pressure table. Alternatively, pressure control subroutine 85 can be written to open or close throttle valve 12a to a particular opening size to regulate chamber 10 to attain a desired pressure.

Plasma control subroutine 90 comprises program code for setting the RF voltage power level applied to RF generators 32, 36 and 50 in chamber 10, and optionally, to set the level of the magnetic field generated in the chamber. The plasma control subroutine 90, like the previously described chamber component subroutines, is invoked by chamber manager subroutine 77a.

An example of such an HDP-CVD apparatus along with the advantages of each of the three capacitively coupled configurations and the specific details concerning the inductively coupled configurations is described in U.S. patent application Ser. No. 08/234,746 entitled "High Density Plasma CVD Reactor with Combined Inductive and Capacitive Coupling," by Nowak, Fairbairn and Redeker, filed Apr. 26, 1994, the disclosure of which is incorporated herein by reference.

The above description is for illustrative purposes only and should not be considered as limiting the scope of the present invention. Variations of the above-described system, such as variations in pedestal design, chamber design, location of RF power connections and gas injection nozzles, other variations are possible. The method and apparatus of the present invention are not necessarily limited to any specific deposition system.

II. Exemplary Structure

Figure 2:
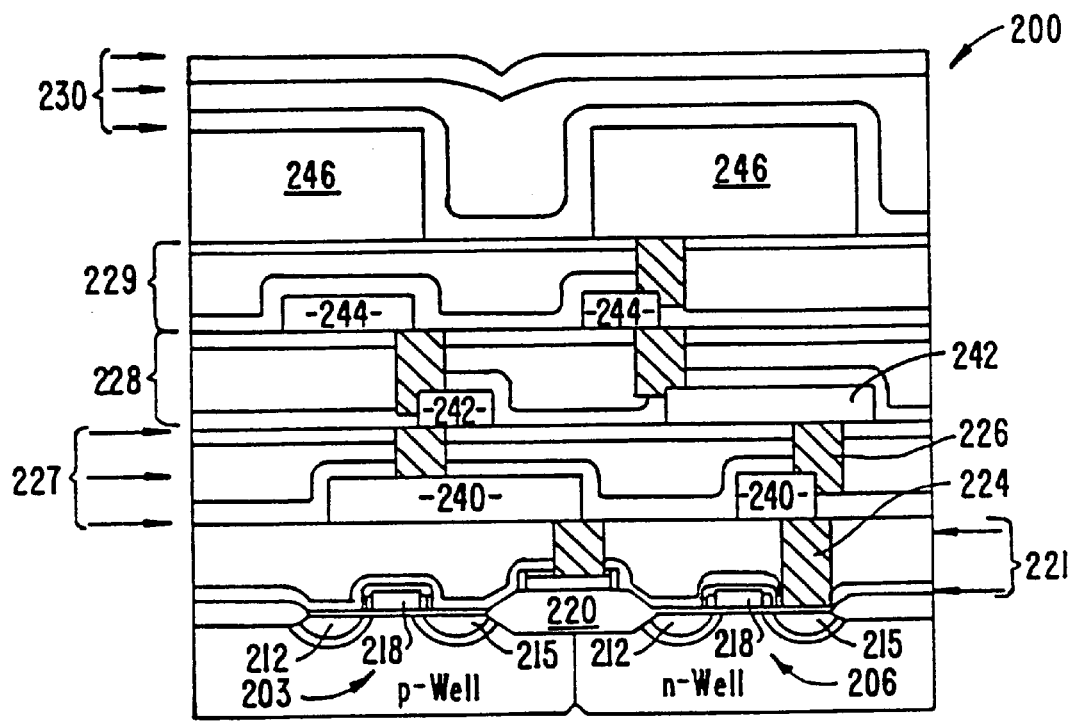
FIG. 2 is a simplified cross-sectional view of a semiconductor device manufactured according to an embodiment of the present invention.

FIG. 2 illustrates a simplified cross-sectional view of an integrated circuit 200 according to the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a shallow trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers 240, 242, 244, and 246, included in integrated circuit 200. Each metal layer 240, 242, 244, and 246 is separated from adjacent metal layers by respective inter-metal dielectric layers 227, 228, and 229. Adjacent metal layers are connected at selected openings by vias 226. Deposited over metal layer 246 are planarized passivation layers 230. CVD apparatus 5 may be used to deposit dielectric films used, for example, as PMD layer 221; as IMD layers 227, 228, and 229; and/or as passivation layer 230.

It should be understood that simplified integrated circuit 200 is for illustrative purposes only. One of ordinary skill in the art could implement the present method for fabrication of other integrated circuits such as microprocessors, application specific integrated circuits (ASICs), memory devices, and the like. Further, the present invention may be applied to PMOS, NMOS, CMOS, bipolar, or BiCMOS devices. Although integrated circuit 200 discussed above has four metal layers, integrated circuits having additional or even fewer metal layers also may be fabricated using the present invention. Exemplary wafer deposition processes, particularly deposition processes of PSG films for PMD applications, within chamber 10 are further described below, in accordance to various embodiments of the present invention.

III. Exemplary Deposition of Phosphosilicate Glass for PMD Applications

According to embodiments of the present invention, dielectric films used, for example, as PMD layers may be formed using any of several different processes. Process recipes of PSG films are set forth below as examples of dielectric films suitable for use as PMD layers in the present invention. In preferred embodiments, the exemplary processes are performed in HDP-CVD apparatus 5, which produces an inductively-coupled plasma.

As merely examples, the PSG film deposition recipes described below are capable of forming PSG films that may be particularly useful as PMD layers. Of course, the recipes may be varied depending on the desired qualities of the PSG films. For example, although phosphine ($PH_3$) is used in the exemplary recipes, other examples of phosphorus sources that could be used include triethylphosphate (TEPO), triethylphosphite ($TEP_i$), trimethylphosphate (TMOP), trimethylphosphite ($TMP_i$), and other similar compounds. Also, other examples of silicon sources that could be used besides silane ($SiH_4$) include TEOS or a similar silicon source, and other examples of oxygen sources that could be used besides $O_2$ include $O_3$ or other oxygen source. In the descriptions below, gas sources are used and flow rates are provided in standard cubic centimeters per minute (sccm). In other embodiments, liquid sources may be vaporized using a bubbler or liquid injection system. In preferred embodiments, a low moisture PSG film may be formed using the exemplary $SiH_4/PH_3/O_2/Ar$ process, described below, conducted in HDP-CVD system 5 to provide a planarized insulating layer with good gap-fill capability and low stress.

In the exemplary process, a substrate is transferred to an HDP-CVD chamber 10 of FIG. 1A. Before the substrate transfer, multiple process steps including forming gate electrodes typically have occurred. The substrate is loaded into chamber 10 through a vacuum-lock door (not shown) and placed onto pedestal 44. Once the substrate is properly positioned, a process gas is introduced into process chamber 10 from gas injection nozzles 14. The process gas is a mixture comprising a gaseous source of silicon, a gaseous source of phosphorus, and a gaseous source of oxygen. Additionally, the process gas may include a gaseous source of a heavy inert gas to enhance sputtering effects during deposition.

In a preferred embodiment, the gaseous mixture consists of a silicon-containing gas such as $SiH_4$, a phosphorus-containing gas such as $PH_3$, an oxygen-containing gas such as $O_2$, and an inert gas such as argon. Preferably, $PH_3$ diluted in $SiH_4$ is introduced into vacuum chamber 10 from the gas injection nozzles in a quantity where phosphine preferably ranges from about 10–50%, most preferably about 46%, of the total phosphine and silane (i.e., total hydride) introduced into the chamber, depending on the desired deposition rate and the desired wt % of phosphorus in the deposited film as described in more detail below. The ratio of phosphine to the total phosphine/silane gas mixture is hereinafter referred to as the "phosphine:hydride ratio." The total $PH_3$ and $SiH_4$ gas mixture is introduced at a rate preferably between about 30–70 sccm, most preferably about 50 sccm. Oxygen in the form of $O_2$, or a similar oxygen source, is preferably introduced from the gas injection nozzles at a rate of between about 60–100 sccm, most preferably about 80 sccm. Argon is preferably introduced from the gas injection nozzles at a rate of between about 10–30 sccm, most preferably about 20 sccm. The ratio of oxygen to total hydride (phosphine and silane) is preferably from about 2:1 to about 1.43:1, most preferably about 1.6:1. In the specific embodiment, the $PH_3$, $SiH_4$ and argon are introduced from some of the injection nozzles into the chamber, and the $O_2$ is introduced from other injection nozzles into the chamber. Of course, it is possible that different combinations of the gaseous sources may be introduced from the same or different injection nozzles. The total gas flow into vacuum chamber 10 through gas injection nozzles 14 is preferably between about 100–200 sccm, most preferably about 150 sccm.

A selected pressure between about 1 millitorr (mtorr) and about 100 mtorr, preferably between about 1–25 mtorr, and most preferably between about 4–8 mtorr, in vacuum chamber 10 is maintained throughout introduction of the process gas and deposition by throttle valve 12a in conjunction with vacuum pump 12. Also, the temperature of pedestal 44 within chamber 10 is maintained (through the use of a heat-transfer gas like helium in the wafer chuck at a pressure from about 0.75–3.0 torr) at between about 400–650° C., preferably about 450° C., during film deposition in accordance with some embodiments. In other preferred embodiments, the temperature of pedestal 44 within chamber 10 may be maintained at between about 550–650° C., eliminating the need for subsequent annealing of the deposited film.

After processing conditions are set, RF energy is applied to helically coiled antenna 26 by SRF generator 32 to form an inductive plasma. SRF generator 32 continues to apply RF energy to coiled antenna 26 throughout this process. SRF generator 32 is driven at a frequency of about 2 MHz at between about 1000–4500 Watts, preferably between about 2500–4000 Watts, and most preferably at about 3500 Watts, in some specific embodiments. Preferably, during deposition of the PSG film, the plasma is biased toward the substrate and is further excited by capacitively coupling RF energy from BRF generator 50 to pedestal 44. BRF generator 50 is driven at a frequency of about 1.8 MHz at between about 500–2500 Watts, preferably between about 1300–2000 Watts, and most preferably about 1500–1600 Watts. Preferably, the plasma is biased toward the substrate by applying a positive DC voltage of about 700 Volts (V). Maintaining the plasma for a selected time period under these conditions results in the deposition of a PSG film on the substrate on pedestal 44. Of course, other frequencies, voltages, and power levels may also be used to bias the plasma toward the substrate, in accordance with other embodiments.

It is recognized that the high density of HDP-CVD plasma promotes sputtering effects during deposition. The sputtering effects are believed to etch away deposition on the sides of the gaps to be filled, thereby contributing to the gap filling capability of the HDP-CVD deposited film. The increased ion bombardment toward pedestal 44 due to application of BRF enhances sputtering thereby allowing the growing film to better fill closely-spaced gaps. The use of argon, or alternatively another heavy inert gas, further promotes these sputtering effects.

The above conditions result in PSG films deposited at a rate of between about 2000–2800 Å/minute. By controlling the deposition time, the thickness of the PSG film deposited may thus be easily controlled. Preferably, the phosphorus in the resulting PSG film ranges between about 1–12 wt %, depending on the specific application of the film, and preferably is about 4 wt % in some applications (such as for logic devices) and about 6–8 wt % in other applications (such as for memory devices such as Electrically-Erasable Programmable Read-Only Memory (EEPROM) or flash memory).

Regardless of whether or not a subsequent annealing is performed, the deposited PSG film is compatible with a subsequent CMP. More specifically, the CMP etch rate of the dense HDP-CVD film is slower and therefore more easily controlled than the CMP etch rate of less dense films deposited using many other types of deposition apparatus, as described further below.

In some preferred embodiments, the deposited HDP-CVD PSG film may be further densified by annealing the film at a temperature ranging between about 450–850° C. in a nitrogen ($N_2$) ambient environment. This annealing step also serves to activate the phosphorus in the PSG film for providing gettering capability to trap mobile ions. Either the unannealed PSG film, being dense, or the annealed PSG film, being further densified, is compatible with a subsequent CMP step, which provides further planarization. In contrast, films deposited using some other systems besides HDP-CVD systems are often not dense enough and so may open up voids or seams after a subsequent CMP step, as well as having a CMP etch rate that is too high and therefore difficult to control.

In alternative preferred embodiments, the HDP-CVD PSG film may be deposited with pedestal 44 maintained at between about 550–650° C., as mentioned above, eliminating the need for subsequent annealing and being compatible with a subsequent CMP. With these alternative preferred embodiments, the HDP-CVD PSG film deposited at high enough temperatures activates the phosphorus to provide gettering capability without requiring an annealing step, as well as providing a dense film compatible with a subsequent CMP step. Advantageously, a process step (annealing) may be eliminated with these alternative embodiments.

The parameters in the above PSG processes should not be considered limiting to the claims. For example, the flow values discussed above apply for an HDP-CVD chamber (having a 22 liter total volume and outfitted for 200-mm wafers) in a 5200 Centura™ HDP-CVD system available from Applied Materials, Inc., but these values may differ depending on the type or size of the chamber used. Embodiments of the present invention may also be applicable to apparatus equipped for other wafers, such as 150-mm wafers and 300-mm wafers. One of ordinary skill in the art can also use other chemicals, chamber parameters, and conditions to produce similar films.

IV. Experimental Results

To illustrate the effectiveness of the method of the present invention, experiments were performed depositing a PSG film according to the embodiment of the method of the present invention. The PSG film was deposited over a low-resistivity P type silicon substrate in the HDP-CVD system (having a 22 liter volume and equipped for 200-mm wafers) mentioned above. For the experiments described below, the process conditions described herein remained constant, unless otherwise indicated. Specifically, the $PH_3$ and $SiH_4$ gas mixture (with phosphine being about 46% of the total hydride mixture) was introduced into the chamber at a rate of about 50 sccm, oxygen was introduced into the chamber at a rate of about 80 sccm, and argon was introduced into the chamber at a rate of about 20 sccm. The ratio of oxygen to total hydride is about 1.6:1. The temperature of pedestal 44 in the vacuum chamber was maintained at about 450° C. using helium heat-transfer gas at about 1.0 torr, and the pressure within the chamber was maintained at about 7 mtorr. An inductively coupled plasma was formed by setting the source RF (about 2.0 MHz) power at about 3500 Watts, and applying bias RF (about 1.8 MHz) power at about 1500–1600 Watts. The resulting PSG film has a about 6.5 wt % phosphorus, unless otherwise indicated.

Figure 3:
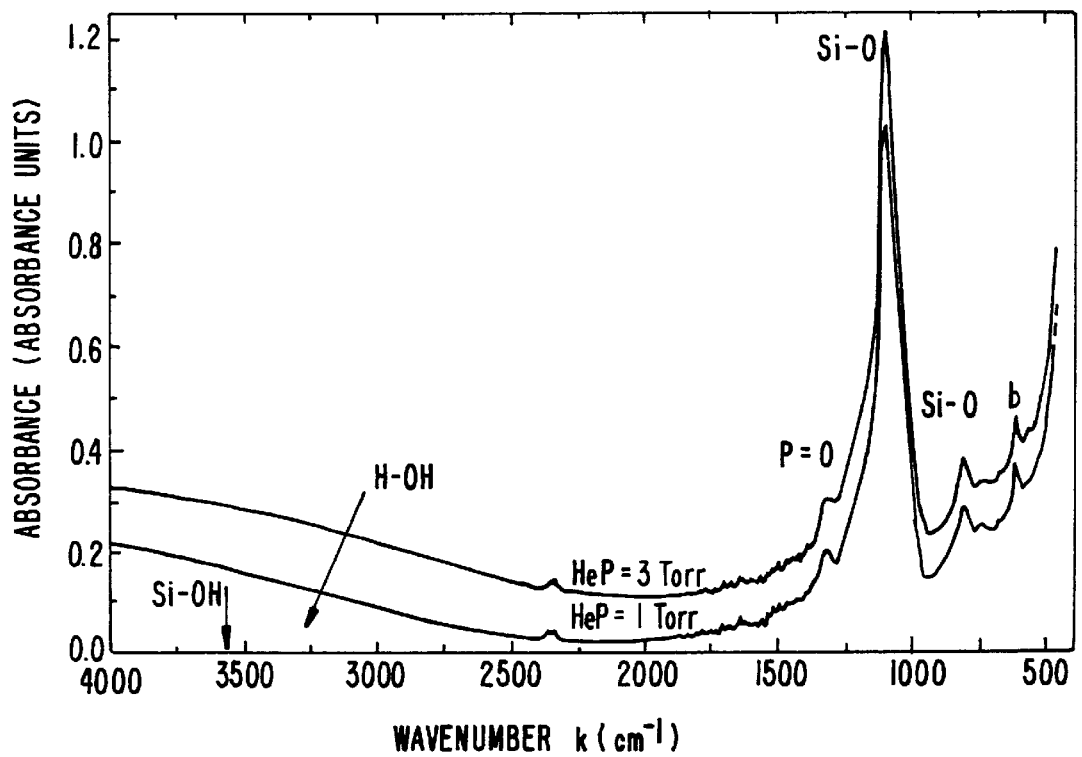
FIG. 3 is a graph illustrating absorbance as a function of wavenumber of the unannealed, as-deposited HDP-CVD PSG film using an experimental process recipe according to a specific embodiment of the present invention.
Figure 4:
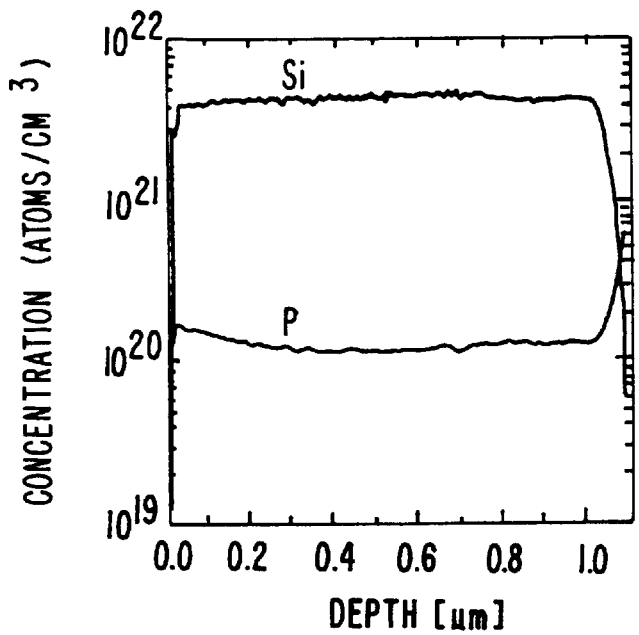
FIG. 4 is a graph illustrating the silicon and phosphorus concentration (atoms/cm$^3$) as a function of depth ($\mu$m) in the PSG film of FIG. 3 according to a specific embodiment of the present invention.

FIGS. 3–8 illustrate various test results for HDP-CVD PSG films deposited using the experimental process recipe discussed above, unless otherwise indicated, without annealing. FIG. 3 is a graph illustrating absorbance (absorbance units) as a function of wavenumber ($cm^{-1}$) of the unannealed, as-deposited HDP-CVD PSG film using the experimental process recipe discussed above. Moisture content of the PSG film was measured using Fourier Transform Infrared (FTIR) spectroscopy, as is well known to one of ordinary skill in the art. As seen in FIG. 3, the deposited PSG film shows no moisture absorbance for two different values of heat-transfer gas pressure (or back-side pressure) of about 1.0 torr or about 3.0 torr. FIG. 3 indicates the dense nature of the deposited PSG film using the process recipe, according to the specific embodiment. The silicon and phosphorus concentration of the PSG film of FIG. 3 is shown in FIG. 4.

FIG. 4 is a graph illustrating the concentration (atoms/cm$^3$) as a function of depth ($\mu$m) in the PSG film. The dopant concentration was measured using Secondary Ion Mass Spectroscopy (SIMS), as is well known to one of ordinary skill in the art. FIG. 4 demonstrates that the phosphorus content is very uniform throughout the thickness of the PSG film, which is desirable in many applications.

Figure 5:
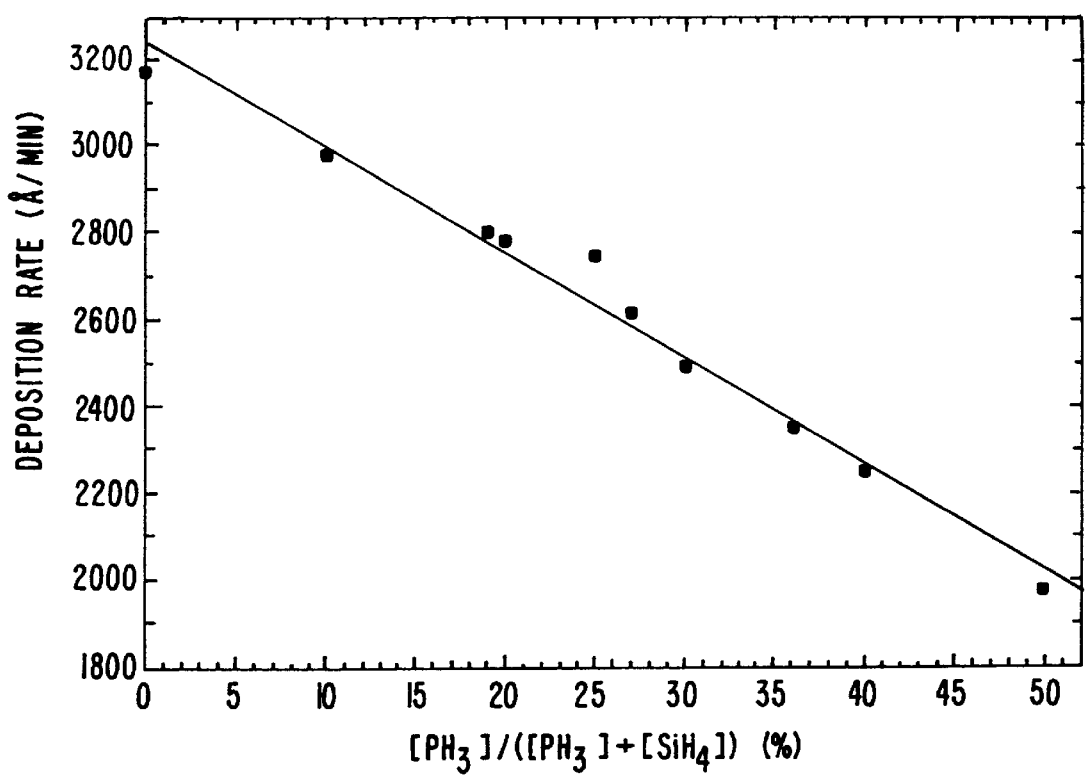
FIG. 5 is a graph illustrating the relation between the HDP-CVD PSG film deposition rate (Å/minute) and the phosphine:hydride ratio (%), according to a specific embodiment of the present invention.

FIG. 5 is a graph illustrating the relation between the HDP-CVD PSG film deposition rate (Å/minute) and the ratio (%) of phosphine content to total phosphine and silane gas mixture introduced into the chamber during deposition. The PSG film was deposited using the above-discussed process recipe with bias RF set to about 1500 Watts. For the preferred range of phosphine:hydride ratios (10–50%) discussed above for exemplary process recipes, the deposition rate ranges between about 3000 and 2000 Å/min, with the deposition rate decreasing in a substantially linear manner as the phosphine:hydride ratio increases. The experimental results indicate that for higher deposition rates from about 3000 to 2600 Å/min, the phosphine:hydride ratio is preferably between about 10–26%.

Figure 6:
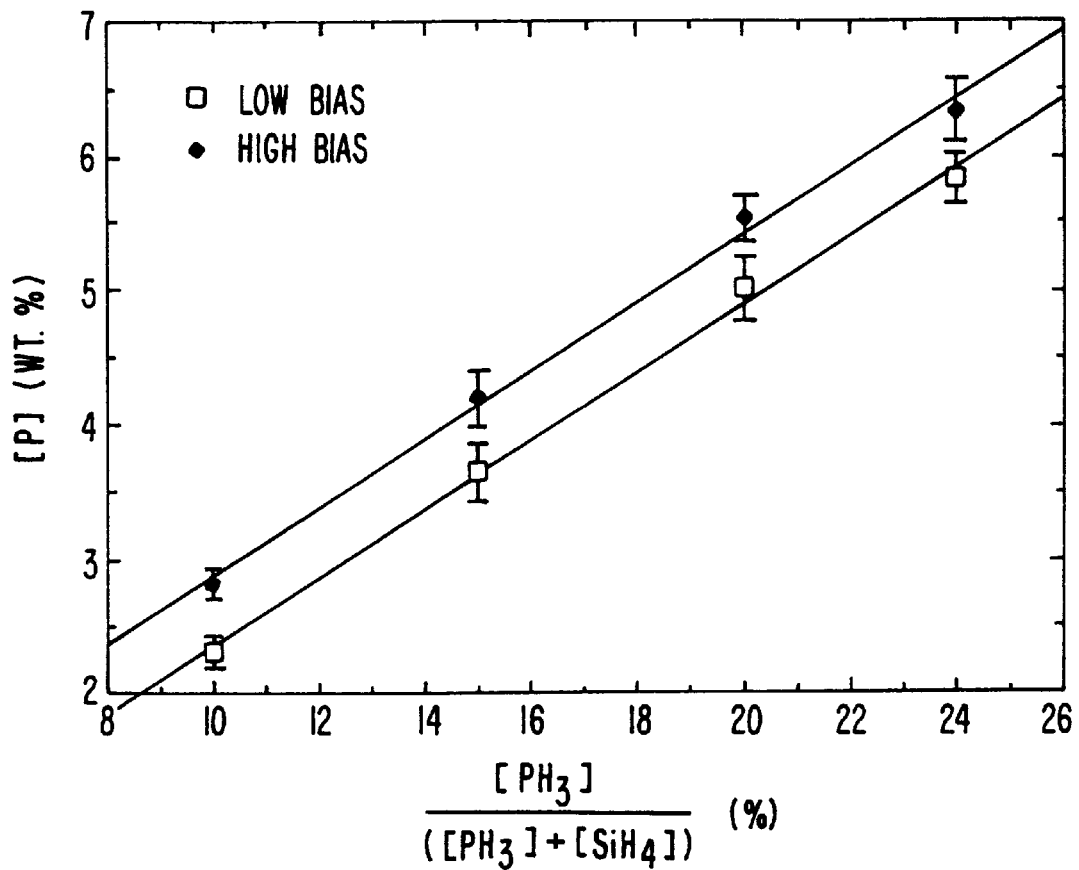
FIG. 6 illustrates the relation between phosphine:hydride ratio and phosphorus wt % in the deposited PSG film using two different bias RF power levels, according to a specific embodiment of the present invention.

FIG. 6 illustrates the relation between phosphine:hydride ratio and phosphorus wt % in the deposited PSG film using two different bias RF power levels. For a phosphine:hydride ratio varied between about 10–26%, the wt % of phosphorus in the deposited film generally ranges between about 2–7 wt % for a "low bias RF" power level of about 1300 Watts (corresponding to about 4.1 Watts/cm$^2$) and for a "high bias RF" power level of about 1600 Watts (corresponding to about 5.51 Watts/cm$^2$). FIG. 6 also indicates that increasing the bias RF power level increases the wt % of phosphorus in the deposited PSG film. The increased bias RF power level increases the sputtering effects in the HDP-CVD process, resulting in higher incorporation of phosphorus in the deposited film. More specifically, FIG. 6 illustrates that PSG films having about 6.5 wt % and about 4 wt % of phosphorus may be deposited at the high bias RF power level of 1600 Watts by using a phosphine:hydride ratio of about 24% and about 15%, respectively, at a hydride flow rate of about 50 sccm.

Figure 7:
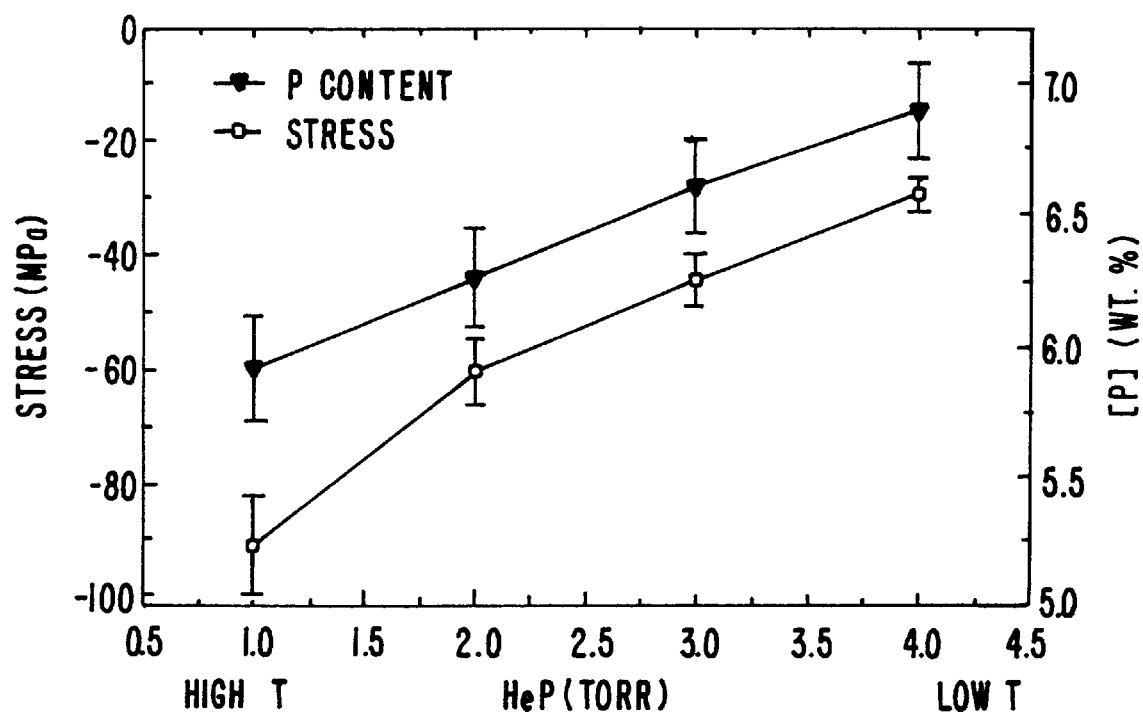
FIG. 7 illustrates the phosphorus content (wt %) and stress (MPa) evolution of the deposited PSG film for varying deposition temperatures as indicated by the helium heat-transfer gas pressure, HeP (torr)

FIG. 7 illustrates the phosphorus content (wt %) and stress (MPa) evolution of the PSG film deposited using the experimental process recipe with varying deposition temperatures as indicated by the helium heat-transfer gas pressure, HeP (torr). As shown by FIG. 7, the phosphorus content in the PSG film generally increases as the deposition temperature decreases (i.e., the heat-transfer gas pressure increases and cools the wafer on the pedestal). More specifically, for heat-transfer gas pressures of about 1.0, 2.0, 3.0 and 4.0 torr, the corresponding phosphorus contents of the deposited PSG films are about 6.0, 6.3, 6.6 and 6.9 wt % phosphorus. FIG. 7 also demonstrates that these PSG films are compressively stressed, with the films tending to become more tensile in stress as the heat-transfer gas pressure increases (i.e., deposition temperature decreases).

Figure 8:
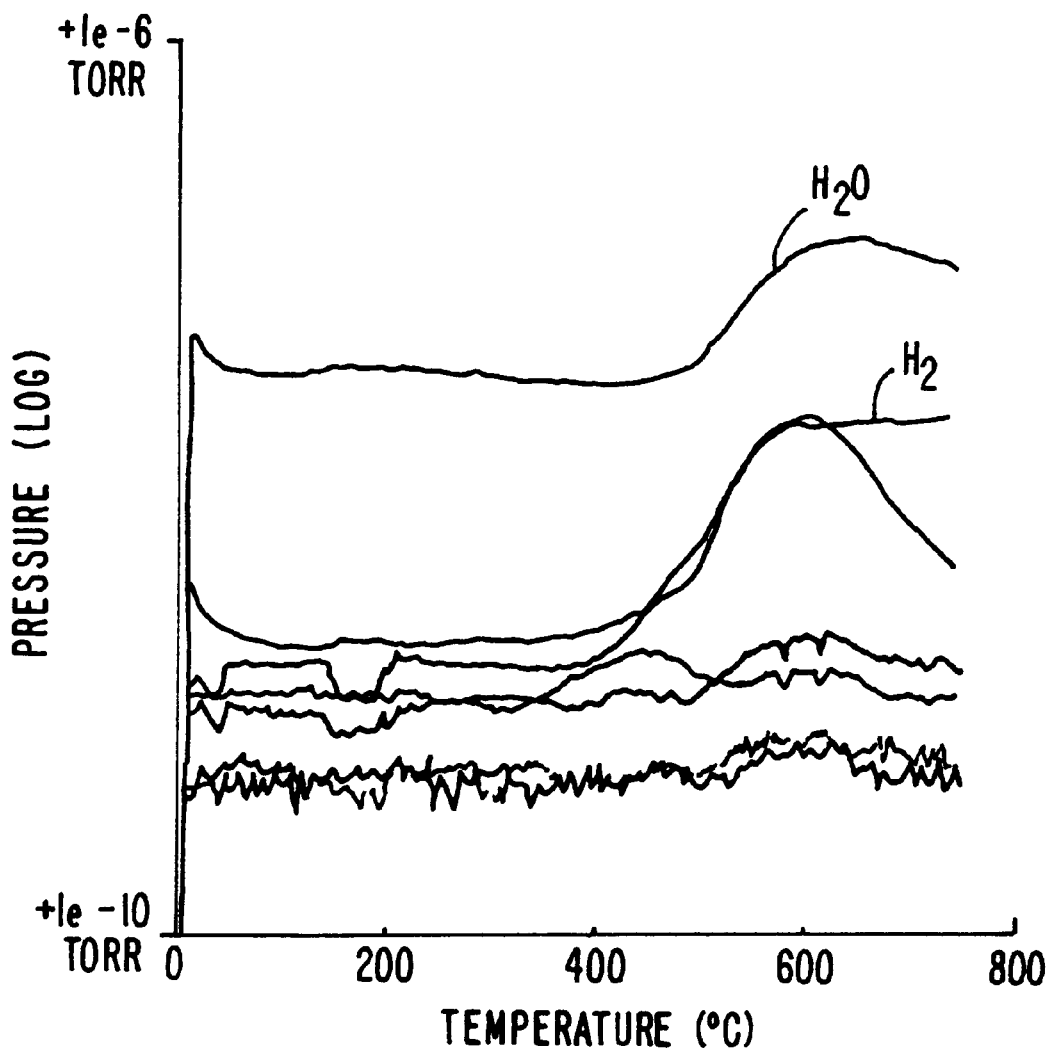
FIG. 8 shows the thermal desorption spectrum of the deposited HDP-CVD PSG film over a range of temperatures.

FIG. 8 shows the thermal desorption spectrum of the deposited PSG film over a range of temperatures. The data in FIG. 8 was obtained using Thermal Desorption Spectroscopy (TDS) measurements on the PSG film deposited using the experimental process recipe but at about 400° C. The TDS measurements, which were conducted on the HDP-CVD PSG film, were performed by heating the deposited film in a furnace over a range of temperatures (from 0–800° C.), to demonstrate the stability of the deposited film. The furnace was evacuated to a baseline pressure of about 1×10$^{-10}$ torr at the start of the measurements. As shown in FIG. 8, water (H$_2$O) and hydrogen (H$_2$) outgas from the HDP-CVD PSG film (deposited at about 400° C.) at a furnace temperature of about 500° C. The thermal desorption spectrum shown in FIG. 8 for the HDP-CVD PSG film is comparable to that of high quality HDP-CVD USG films which have been demonstrated to be stable. Similar experiments performed with HDP-CVD PSG films deposited at temperatures lower than about 400° C. indicated that the outgassing occurred at temperatures lower than about 500° C. HDP-CVD PSG films deposited at temperatures higher than about 400° C. are therefore believed to outgas at temperatures higher than about 500° C.

Figure 11:
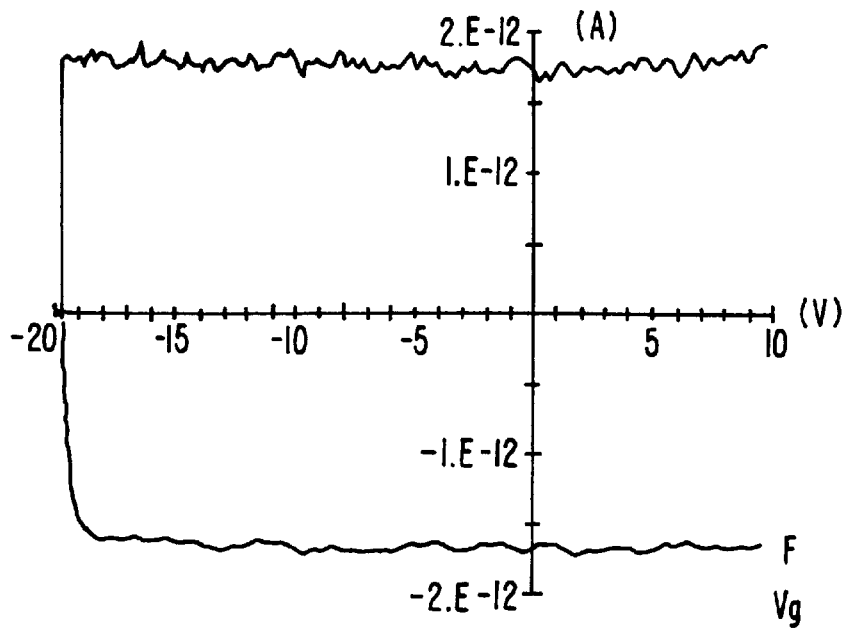
FIG. 11 illustrates gettering capability of the PSG film using Triangular Sweep Voltage techniques at 300° C., according to a specific embodiment of the present invention.
Figure 9:
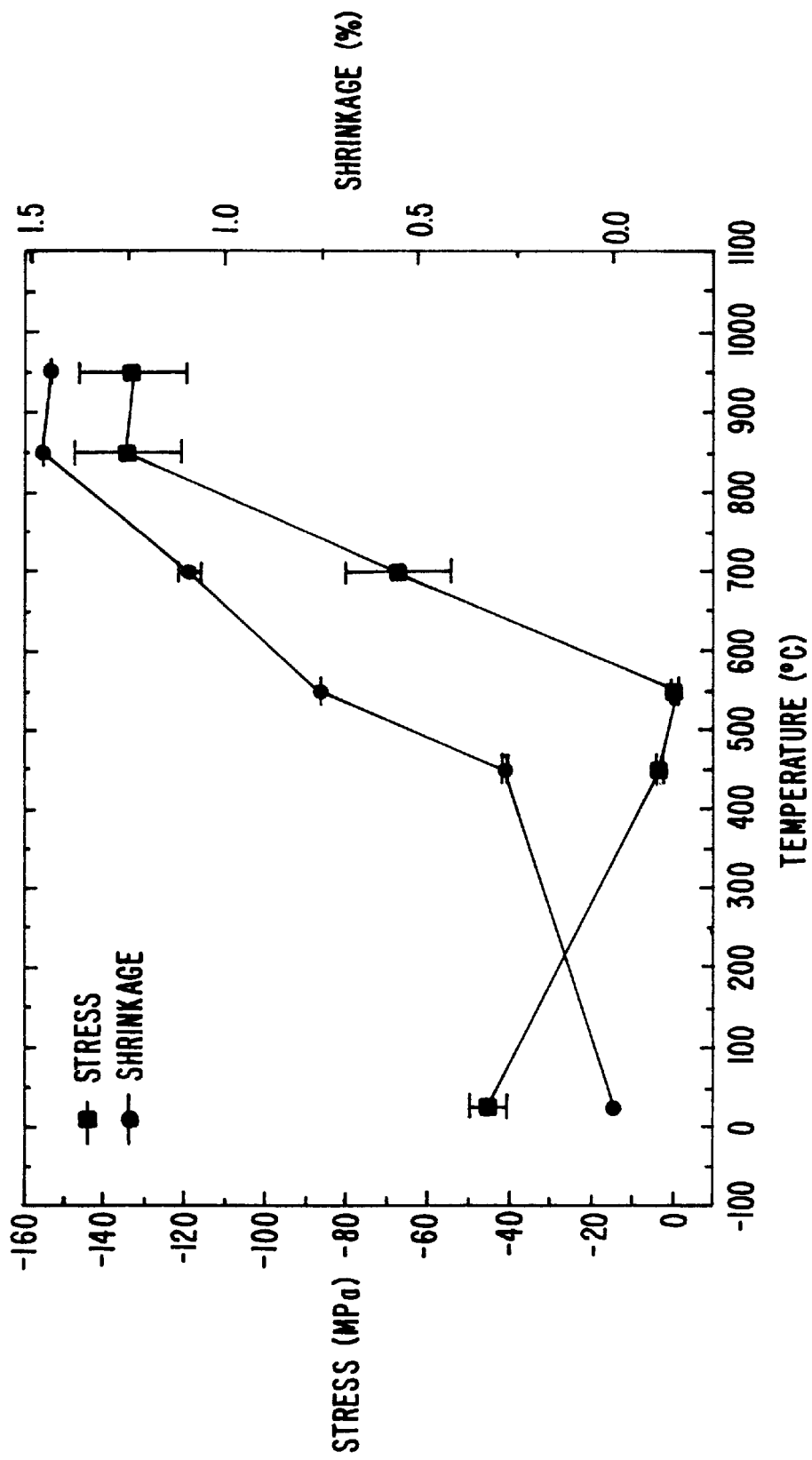
FIG. 9 is a graph showing the stress (megaPascal, i.e. MPa) and film shrinkage (%) of the PSG film deposited under experimental conditions as a function of annealing temperature (°C.), according to a specific embodiment of the present invention.
Figure 10:
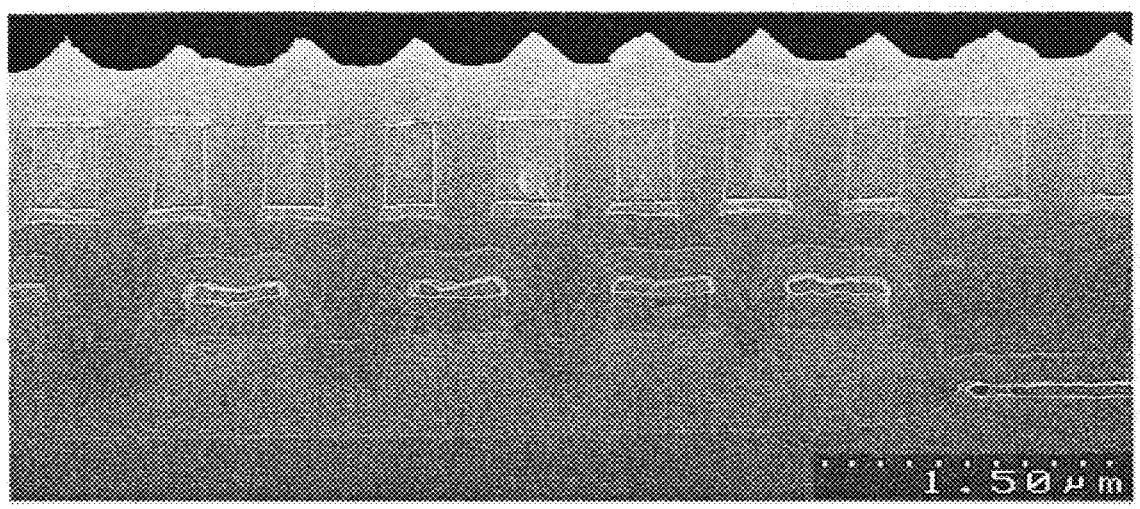
FIG. 10 is a secondary electron micrograph (SEM) showing the gap filling capability of the PSG film used as a PMD layer over a gap (between the closest adjacent gate electrodes) having about a 0.25 $\mu$m width and about a 2:1 aspect ratio, according to a specific embodiment of the present invention.

FIGS. 9–11 illustrate various test results for HDP-CVD PSG films deposited and then annealed, as described below. FIG. 9 is a graph showing the stress (megaPascal, i.e. MPa) and film shrinkage (%) of the PSG film deposited under the above experimental conditions as a function of annealing temperature (°C). As shown in FIG. 9, the PSG film as deposited is compressive, having a stress ranging between about −40 MPa to about 0 MPa for temperatures between about 25° C. to about 450° C. The PSG film then becomes tensile as the film is heated up to about 500° C. At temperatures greater than about 500° C., the film becomes more compressive and the stress stabilizes at about −135 MPa. FIG. 9 also demonstrates that the PSG film has low shrinkage for annealing temperatures between about 25° C. to about 600° C., and shrinkage greater than about 1.0% for annealing temperatures above about 600° C. Shrinkage of the film stabilizes above 850° C., indicating complete densification of the film.

FIG. 10 is a secondary electron micrograph (SEM) showing the gap filling capability of the PSG film used as a PMD layer over a gap (between the closest adjacent gate electrodes) having about a 0.35 $\mu$m width and about a 2:1 aspect ratio. The PSG film shown in FIG. 10 was deposited under the above described experimental conditions and then annealed at about 850° C. for about 20 minutes. As seen in FIG. 10, the PSG film exhibits good gap fill capability.

The PSG film of FIG. 10 also provides efficient gettering capability, as shown in FIG. 11, which illustrates that there is no mobile charge peak in the film. FIG. 11 shows measurements by a Triangular Sweep Voltage technique, well known by one of ordinary skill in the art, performed at 300° C. The test was conducted by subjecting the MOS capacitors shown in FIG. 10 to a positive voltage (+100 V) during 20 minutes to accumulate positive mobile charges in the dielectric at the Si/SiO$_2$ interface. A linear-voltage ramp (7 V/min from +10V to −10V) was then applied on the metal electrode in order to accumulate the mobile charges at the metal/SiO$_2$ interface, and immediately thereafter, a second linear-voltage ramp in the opposite direction was applied to induce an opposite move. The absence of mobile charge peaks indicates that the PSG film has efficiently gettered any mobile charges.

Figure 12:
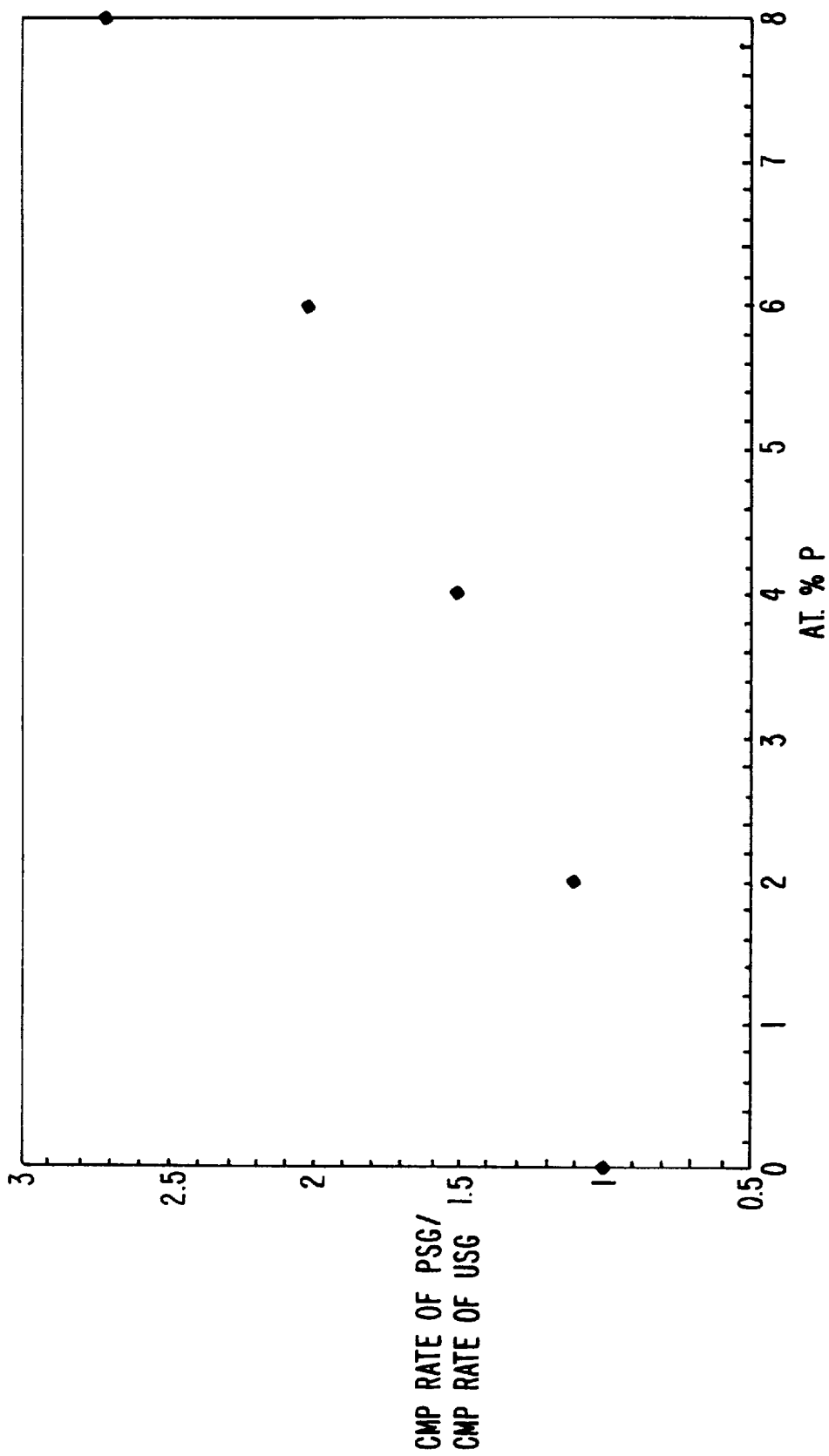
FIG. 12 illustrates the relation between atomic % of phosphorus in the PSG film and the ratio between CMP rates of the HDP-CVD PSG film and HDP-CVD undoped silicate glass (USG) film.

FIG. 12 illustrates the relation between atomic % of phosphorus in the PSG film and the ratio between CMP rates of the HDP-CVD PSG film and the HDP-CVD undoped silicate glass (USG) film. Both the PSG and USG films were not annealed. A 1.5 $\mu$m standard HDP-CVD USG film was deposited using HDPCVD according to the experimental process recipe without phosphine and 1.5 $\mu$m HDP-CVD PSG films (with varying phosphorus content) were deposited according to the experimental process recipe. Each film was then planarized by CMP. As the atomic % of phosphorus in the PSG film increases, the CMP rate of the PSG film increases, as shown in FIG. 12. When similar experiments were performed using other films (deposited with different systems than HDP-CVD systems) in relation to HDP-CVD USG films (in order to compare to FIG. 12), the CMP rates of HDP-CVD PSG films was seen to be up to almost 50% slower than the CMP rates of a BPSG film. Accordingly, the CMP rate of HDP-CVD PSG is slower and more easily controlled than with BPSG films, which are commonly used in PMD applications.

Further tests using colorimetry, as is well known in the art, on HDP-CVD PSG films deposited at different temperatures were conducted that indicated the high quality of HDP-CVD PSG films. Both films were 6 wt % phosphorus, unannealed HDP-CVD PSG films, deposited at about 350° C. (corresponding to about 3 torr HeP) and at about 450° C. (corresponding to about 1 torr HeP). Tests on the HDP-CVD PSG film deposited at 350° C. indicated that the film contained about 99.7% phosphorus in the form of $P_2O_5$, with phosphorus in the form of $P_2O_3$ being below detection limits. Tests on the HDP-CVD PSG film deposited at 400° C. indicated that the film contained about 99.8% phosphorus in the form of $P_2O_5$, with phosphorus in the form of $P_2O_3$ being below detection limits. HDP-CVD PSG films deposited at temperatures higher than about 400° C. are believed to contain even closer to 100% phosphorus in the form of $P_2O_5$. These tests indicated that HDP-CVD films have phosphorus in the preferred form of $P_2O_5$ without any significant phosphorus in the form of $P_2O_3$. In contrast, PSG films deposited using other types of CVD apparatus often undesirably result in films with part (on the order of about 5%) of the phosphorus in the form of $P_2O_3$.

Therefore, HDP-CVD PSG films appear very promising for PMD applications where CMP planarization techniques are used. In particular, HDP-CVD PSG films are dense, high quality films having low moisture and low stress. HDP-CVD PSG films also may be deposited with high deposition rates, thereby resulting in higher wafer throughput. Further, HDP-CVD PSG films are CMP compatible whether the HDP-CVD PSG films are annealed or not.

It is to be understood that the above description is intended to be illustrative and not restrictive. Many embodiments will be apparent to those of skill in the art upon reviewing the above description. By way of example, the inventions herein have been illustrated primarily with regard to specific PSG process recipes, but they are not so limited. For example, the dielectric film formed according to other embodiments may be deposited using other oxygen sources besides $O_2$, or using other sputtering gases besides argon. Those skilled in the art will recognize other equivalent or alternative methods of depositing the dielectric layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A process for depositing a film on a substrate disposed on a pedestal in a processing chamber, said process comprising:
   introducing a process gas into said processing chamber, said process gas including $SiH_4$, $PH_3$, $O_2$, and argon;
   controlling said pedestal to a temperature ranging between about 400–650° C.;
   maintaining a pressure ranging between about 1–25 millitorr in said processing chamber;
   applying power to an inductively coupled coil to form a high density plasma from said process gas in said processing chamber;
   biasing said plasma toward said substrate to promote a sputtering effect of said plasma and deposit said film over said substrate, said film comprising a phosphosilicate glass (PSG) film; and
   wherein at least a portion of said maintaining and applying steps occur simultaneously.

2. The process of claim 1 wherein said applying step is performed by applying power ranging between about 2000–3700 Watts to said inductively coupled coil.

3. The process of claim 2 wherein said applying step is performed by applying power of about 3500 Watts to said inductively coupled coil.

4. The process of claim 2 wherein said biasing step is performed by applying a bias power to capacitively coupled electrodes, said bias power ranging between about 1500–2500 Watts.

5. The process of claim 4 wherein said bias power is about 1600 Watts.

6. The process of claim 4, wherein said PSG film is deposited at a temperature of between about 350–500° C.

7. The process of claim 6, wherein said PSG film is deposited at a temperature of about 450° C.

8. The process of claim 4, wherein said PSG film is deposited at a temperature of between about 500–650° C.

9. The process of claim 8, wherein said PSG film is deposited at a temperature of about 550° C.

10. The process of claim 2, wherein said PSG film is deposited at a pressure of between about 4–10 millitorr.

11. The process of claim 10, wherein said PSG film is deposited at a pressure of about 7 millitorr.

12. The process of claim 6 further comprising annealing said PSG film at an annealing temperature ranging between about 450–950° C.

13. The process of claim 8 further comprising chemical mechanical polishing said PSG film.

14. The process of claim 13 wherein said chemical mechanical polishing step is performed without an annealing step.

15. The process of claim 1, wherein at least a portion of said controlling, maintaining, applying and biasing steps occur simultaneously.

16. The process of claim 1, wherein at least a portion of said introducing step occurs simultaneously with at least a portion of said maintaining step.

17. A process for depositing a film on a substrate disposed on a pedestal in a processing chamber, said process comprising:
   introducing a process gas into said processing chamber, said process gas including $SiH_4$, $PH_3$, $O_2$, and argon;
   controlling said pedestal to a temperature ranging between about 400–650° C.;
   maintaining a pressure ranging between about 1–25 millitorr in said processing chamber;
   applying power to an inductively coupled coil to form a high density plasma from said process gas in said processing chamber;
   biasing said plasma toward said substrate to promote a sputtering effect of said plasma and deposit said film over said substrate, said film comprising a phosphosilicate glass (PSG) film; and
   wherein at least a portion of said controlling, maintaining, applying and biasing steps occur simultaneously.

18. The process of claim 17, further comprising annealing said PSG film at an annealing temperature ranging between about 450 degrees Celsius and about 850 degrees Celsius.

19. The process of claim 17, wherein said PSG film is a premetal dielectric layer.

20. The process of claim 17, wherein said PSG film comprises phosphorus, and wherein at least 95% of said phosphorus is in the form $P_2O_5$.

21. The process of claim 17, wherein said PSG film comprises phosphorus, and wherein at least 99% of said phosphorus is in the form $P_2O_5$.

22. The process of claim 17, wherein said PSG film has a phosphorus content that is generally uniform as a function of a film thickness.

* * * * *